US012609655B2

(12) United States Patent
Ohmae

(10) Patent No.: US 12,609,655 B2
(45) Date of Patent: Apr. 21, 2026

(54) RADIO-FREQUENCY CIRCUIT

(71) Applicant: Murata Manufacturing Co., Ltd.,
Nagaokakyo (JP)

(72) Inventor: Yuki Ohmae, Nagaokakyo (JP)

(73) Assignee: **MURATA MANUFACTURING CO.,
LTD.**, Nagaokakyo (JP)

( * ) Notice: Subject to any disclaimer, the term of this
patent is extended or adjusted under 35
U.S.C. 154(b) by 455 days.

(21) Appl. No.: 18/474,232

(22) Filed: Sep. 26, 2023

(65) Prior Publication Data

US 2024/0113661 A1 Apr. 4, 2024

(30) Foreign Application Priority Data

Sep. 30, 2022 (JP) ................................. 2022-158351

(51) Int. Cl.
*H03F 1/30* (2006.01)
*H03F 1/02* (2006.01)
*H03F 3/19* (2006.01)
(52) U.S. Cl.
CPC ............. *H03F 1/0233* (2013.01); *H03F 3/19*
(2013.01); *H03F 2200/105* (2013.01)

(58) Field of Classification Search
CPC ..................................... H03F 1/30; H03F 1/12
USPC ..................................................... 330/297, 51
See application file for complete search history.

(56) References Cited

FOREIGN PATENT DOCUMENTS

JP          2012-134705  A       7/2012
JP          2022-040044  A       3/2022

*Primary Examiner* — Henry Choe
(74) *Attorney, Agent, or Firm* — XSENSUS LLP

(57) ABSTRACT

A power amplifier circuit and an LC circuit are included. The
power amplifier circuit amplifies a radio frequency signal by
switching between the first mode, in which power is ampli-
fied by using the envelope tracking system, and the second
mode, in which power is amplified by using the average
power tracking system. The LC circuit is connected, at its
first end, to the power supply path of the power amplifier
circuit and that is grounded, at its second end, through a
switch circuit. The LC circuit includes a first capacitor and
an inductor that is connected in series to the first capacitor.
The switch circuit is controlled to be switched off in the first
mode and is controlled to be switched on in the second
mode.

20 Claims, 8 Drawing Sheets

RADIO-FREQUENCY CIRCUIT

CROSS-REFERENCE TO RELATED APPLICATION

This application claims priority to Japanese patent application no. JP2022-158351, filed Sep. 30, 2022, the entire contents of which are hereby incorporated by reference.

BACKGROUND

1. Field

The present disclosure relates to a radio-frequency circuit.

2. Description of the Related Art

Techniques for improving efficiency of power amplifier circuits included in wireless communication terminals include the envelope tracking (ET) system and the average power tracking (APT) system which use cascaded multistage amplifier circuits. The ET system achieves improvement of the power efficiency by controlling the power supply voltages of the amplifier circuits in accordance with the amplitude level of an input signal. The APT system achieves improvement of the power efficiency by controlling the power supply voltage of an amplifier circuit in accordance with the average output power. In the related art, a technique for suppressing a reduction of the power efficiency uses grounding of the power node of an amplifier unit through a capacitor and a switch circuit in the fixed-voltage power mode in which the envelope of a signal is less than or equal to a predetermined value.

Recently, radio-frequency modules, in which power amplifier circuits, switch circuits, control circuits, and the like are integrated, are being developed. In such radio-frequency modules, for example, multiple functional devices, such as wafer level chip size packages (WL-CSPs) and surface mount devices (SMDs), are mounted on a low temperature co-fired ceramics (LTCC) substrate or a dielectric substrate.

Application of the related art, described above, to such a radio-frequency module may assume use of a configuration in which an amplifier unit is included in a heterojunction bipolar transistor (HBT) device formed by using an HBT process and in which a switch circuit is included in a silicon device formed by using a silicon process. In this configuration, harmonic components, which are generated by the HBT device, may be coupled to the output signal path through the ground (GND) of an antenna switch circuit included in the same silicon device having the switch circuit, resulting in degradation of the distortion characteristics.

SUMMARY

The present disclosure is made in view of the issue described above, and an object thereof is to implement a radio-frequency circuit that may suppress degradation of the distortion characteristics which is caused by coupling harmonic components, which are generated by an amplifier circuit, to an output signal path.

A radio-frequency circuit according to an exemplary aspect of the present disclosure includes an amplifier circuit that amplifies a radio frequency signal by switching between a first mode, in which power is amplified by using the envelope tracking system, and a second mode, in which power is amplified by using the average power tracking system, and an LC circuit that is connected, at its first end, to a power supply path of the amplifier circuit and that is grounded, at its second end, through a switch circuit. The LC circuit includes a first capacitor and an inductor that is connected in series to the first capacitor. The switch circuit is controlled to be switched off in the first mode and is controlled to be switched on in the second mode.

This configuration enables suppression of degradation of the distortion characteristics caused by coupling noise components, which are caused by the amplifier circuit and which propagate through the LC circuit in the second mode, to the output signal path.

The present disclosure may implement a radio-frequency circuit which may suppress degradation of the distortion characteristics which is caused by coupling harmonic components, which are generated by an amplifier circuit, to an output signal path.

DETAILED DESCRIPTION

A radio-frequency circuit according to exemplary aspects of the present disclosure will be described below in detail on the basis of the drawings. These descriptions do not limit the present disclosure.

Figure 1:
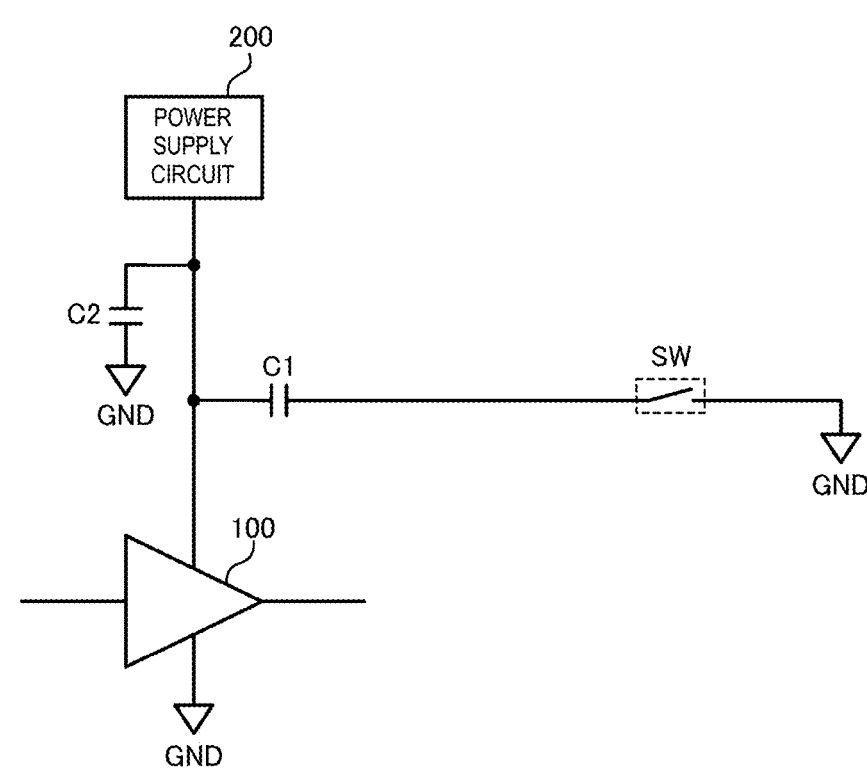
FIG. 1 is a circuit diagram illustrating the fundamental configuration of an exemplary amplifier circuit described in the present disclosure.

FIG. 1 is a circuit diagram illustrating the fundamental configuration of an amplifier circuit described in the present disclosure. In the present disclosure, an amplifier circuit 100 switches the power amplification mode between the envelope tracking (ET) system (hereinafter also referred to as the "first mode") and the average power tracking (APT) system (hereinafter also referred to as the "second mode"). The ET system achieves improvement of power efficiency by controlling the power supply voltage of an amplifier circuit in accordance with the amplitude level of an input signal. The APT system achieves improvement of power efficiency by controlling the power supply voltage of an amplifier circuit in accordance with the average output power.

The amplifier circuit 100 amplifies radio frequency signals on the basis of the power supply voltage supplied from a power supply circuit 200.

In the first mode, a power supply voltage, which follows the envelope of a radio frequency signal, is supplied. Therefore, in the first mode, the tracking accuracy of the power supply voltage for the envelope of a radio frequency signal is important. In contrast, in the second mode, a power supply voltage in accordance with the average output power of a radio frequency signal is supplied. Therefore, in the second mode, stable power supply voltage with respect to a radio frequency signal needs to be supplied. That is, the first mode and the second mode have different decoupling capacitances necessary for the supply path of the power supply voltage.

Therefore, as illustrated in FIG. 1, a first capacitor C1, which is disconnected from the supply path of the power supply voltage by using a switch circuit SW in the first mode, is included in addition to a second capacitor C2 which is always connected to the supply path of the power supply voltage. Specifically, the second capacitor C2 is connected, at its first end, to the supply path of the power supply voltage and is grounded at its second end. The first capacitor C1 is connected, at its first end, to the supply path of the power supply voltage and is grounded, at its second end, through the switch circuit SW in the second mode.

Thus, appropriate design of the capacitance values of the first capacitor C1 and the second capacitor C2 achieves optimal decoupling capacitances applied to the supply path of the power supply voltage in the first mode and the second mode.

Figure 2:
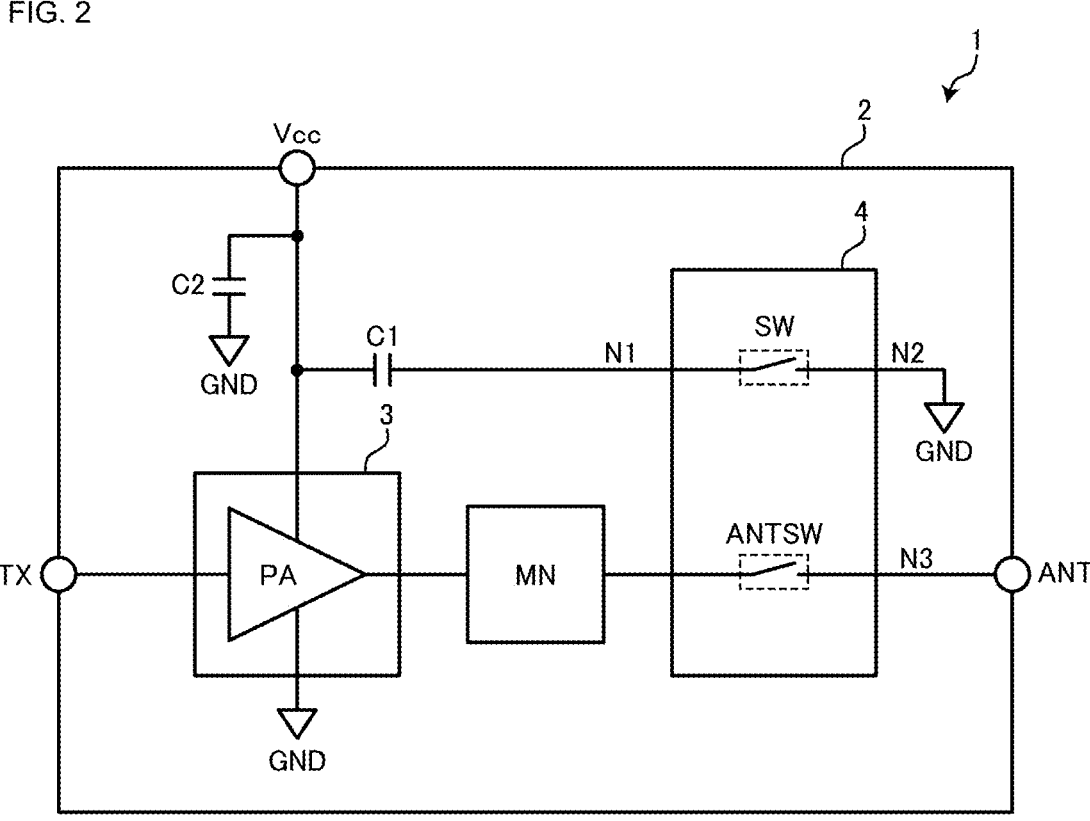
FIG. 2 is a schematic view of an exemplary radio-frequency circuit according to a comparison example.

FIG. 2 is a schematic view of a radio-frequency circuit according to a comparison example.

FIG. 2 illustrates a schematic configuration of a front-end module as an example of a radio-frequency circuit 1. The front-end module is a micro integrated module in which multiple integrated circuits and various functional components, which are mounted on a substrate 2, are integrated. The substrate 2 is, for example, a multilayer ceramic substrate such as a low temperature co-fired ceramics (LTCC) substrate, a resin multilayer substrate, or a film substrate.

As illustrated in FIG. 2, the radio-frequency circuit 1 includes, as principal circuit blocks, a first device 3 and a second device 4.

The first device 3 is, for example, a heterojunction bipolar transistor (HBT) device (integrated circuit: IC) including a gallium arsenide (GaAs) based heterojunction bipolar transistor. A power amplifier circuit PA is formed on the die of the HBT device.

In the configuration illustrated in FIG. 2, a radio frequency signal, which is received at an input terminal TX, is amplified by the power amplifier circuit PA on the first device 3. The amplified radio frequency signal is output from an antenna terminal ANT through a matching circuit MN and the second device 4. The power amplifier circuit PA amplifies a radio frequency signal, which is received at the input terminal TX, on the basis of the power supply voltage received from a power supply terminal Vcc.

The second device 4 is, for example, a silicon device (integrated circuit: IC) including a silicon (Si) based field effect transistor (FET). The switch circuit SW and an antenna switch circuit ANTSW are formed on the die of the silicon device. The switch circuit SW and the antenna switch circuit ANTSW are controlled, for example, by a control circuit (not illustrated) so as to be switched on or off independently.

An output signal from the power amplifier circuit PA is input to the second device 4 through the matching circuit MN. The matching circuit MN is formed, for example, of a surface mount device (SMD), which is disposed on the substrate 2, or a conductor included in the substrate 2.

The antenna switch circuit ANTSW switches the output destination of a radio frequency signal received by the second device 4. FIG. 1 illustrates a single antenna terminal ANT as the output destination of a radio frequency signal received by the second device 4. However, the configuration is not limited to this. For example, a radio frequency signal, whose output destination has been switched by the antenna switch circuit ANTSW, may be output to one of multiple antenna terminals.

The power amplifier circuit PA corresponds to the amplifier circuit 100 illustrated in FIG. 1. That is, in the present disclosure, the power amplifier circuit PA is capable of switching between the first mode, which is the power amplification mode of the envelope tracking (ET) system, and the second mode, which is the power amplification mode of the average power tracking (APT) system.

Figure 3:
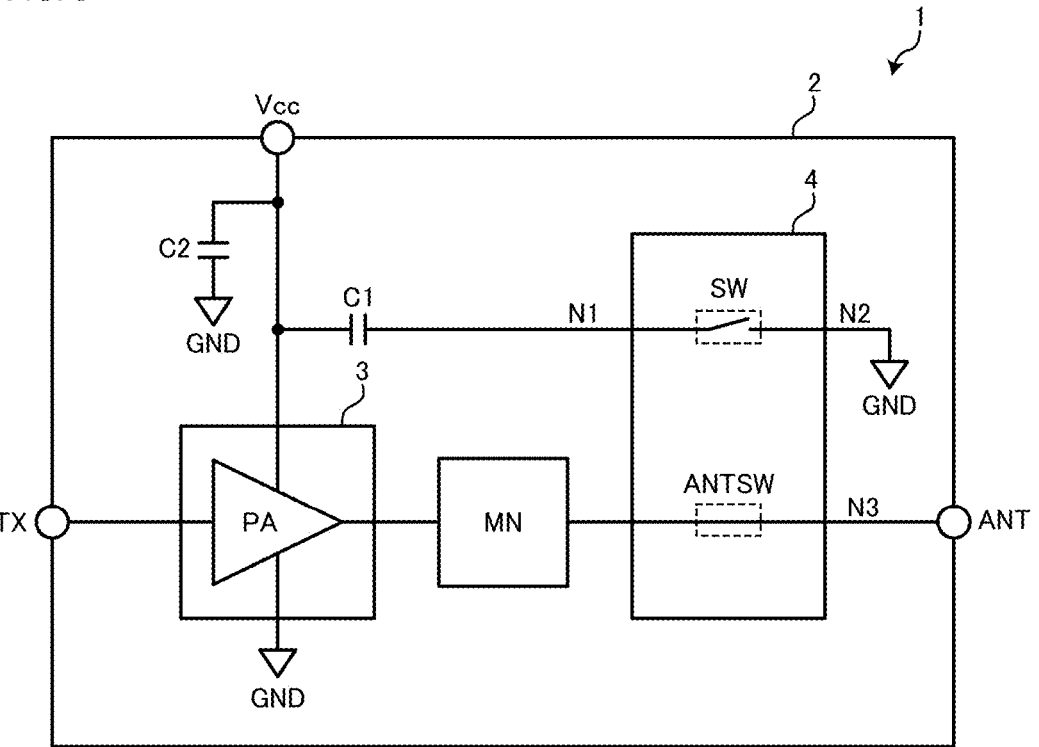
FIG. 3 is a diagram illustrating a form in a first mode according to the comparison example.
Figure 4:
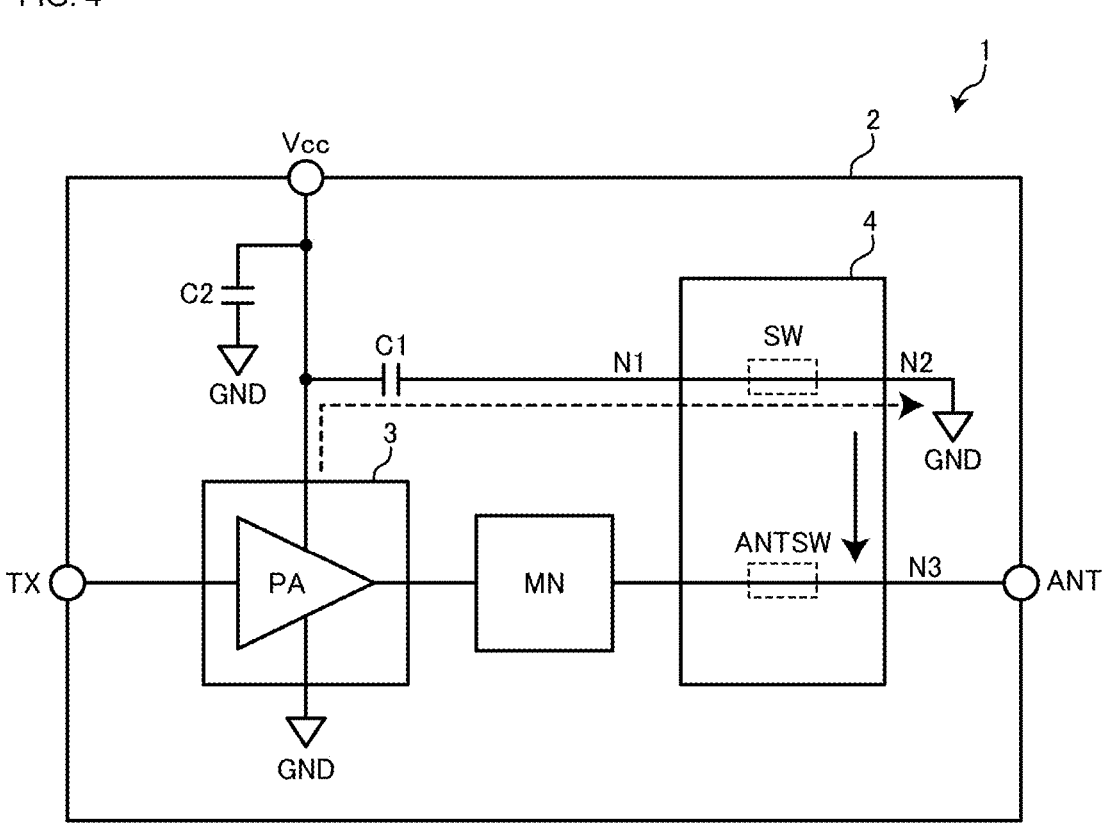
FIG. 4 is a diagram illustrating a form in a second mode according to the comparison example.

FIG. 3 is a diagram illustrating a form in the first mode according to the comparison example. FIG. 4 is a diagram illustrating a form in the second mode according to the comparison example. In the first mode in FIG. 3, the switch circuit SW is controlled to be switched off; in the second mode in FIG. 4, the switch circuit SW is controlled to be switched on. In FIGS. 3 and 4, the antenna switch circuit ANTSW is controlled to be switched on, and a radio frequency signal received by the second device 4 is output to the antenna terminal ANT.

As illustrated in FIG. 3, the switch circuit SW formed on the die of the second device 4 is controlled to be switched off in the first mode, and the first capacitor C1 is thus disconnected from the supply path of the power supply voltage.

As illustrated in FIG. 4, the switch circuit SW formed on the die of the second device 4 is controlled to be switched on in the second mode, and the first capacitor C1 is thus connected to the supply path of the power supply voltage.

In the radio-frequency circuit 1 having the configuration described above, the switch circuit SW, along with the antenna switch circuit ANTSW, is disposed on the second device 4. Thus, in the second mode, the first capacitor C1 is grounded to the ground (GND) potential of the second device 4. As illustrated by using the dashed arrow in FIG. 4, this causes the harmonic components of a radio frequency signal to propagate, as noise components caused by the first device 3, from the power amplifier circuit PA, which is formed on the die of the first device 3, through the first capacitor C1 and the switch circuit SW on the die of the second device 4 to the GND potential of the second device 4. Therefore, as illustrated by using the solid arrow, the harmonic components of the radio frequency signal, which serve as noise components caused by the first device 3, may be coupled to the output path of the radio frequency signal on the second device 4, resulting in degradation of the distortion characteristics.

A configuration, which is in the above-described configuration of the radio-frequency circuit 1 and which may suppress coupling, to the output path of a radio frequency signal on the second device 4, noise components caused by the first device 3 will be described below.

Figure 5:
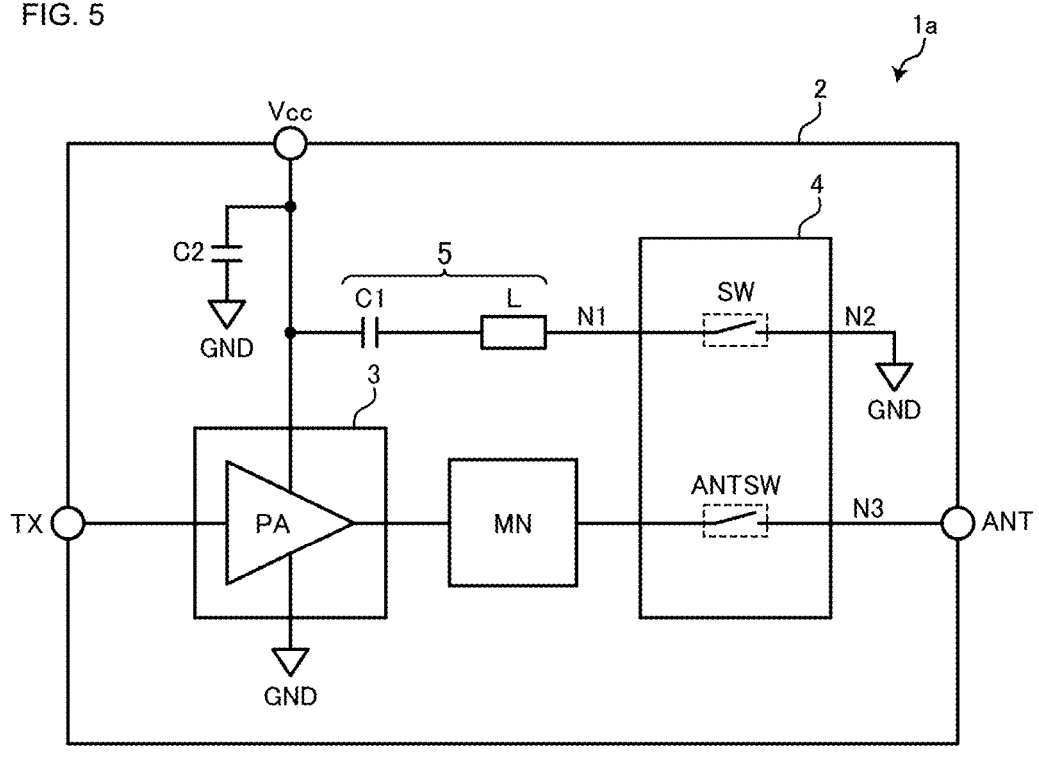
FIG. 5 is a schematic view of an exemplary radio-frequency circuit according to exemplary aspects of the present disclosure.
Figure 6:
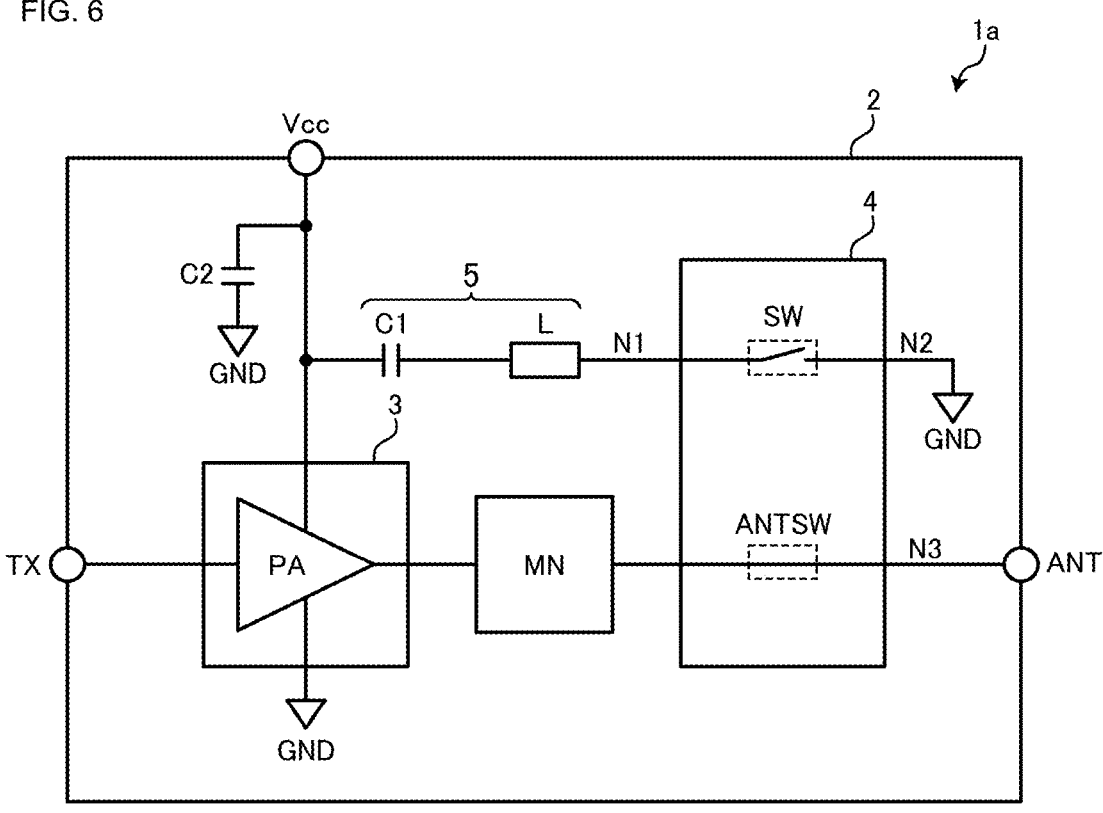
FIG. 6 is a diagram illustrating a form in the first mode according to exemplary aspects of the present disclosure.
Figure 7:
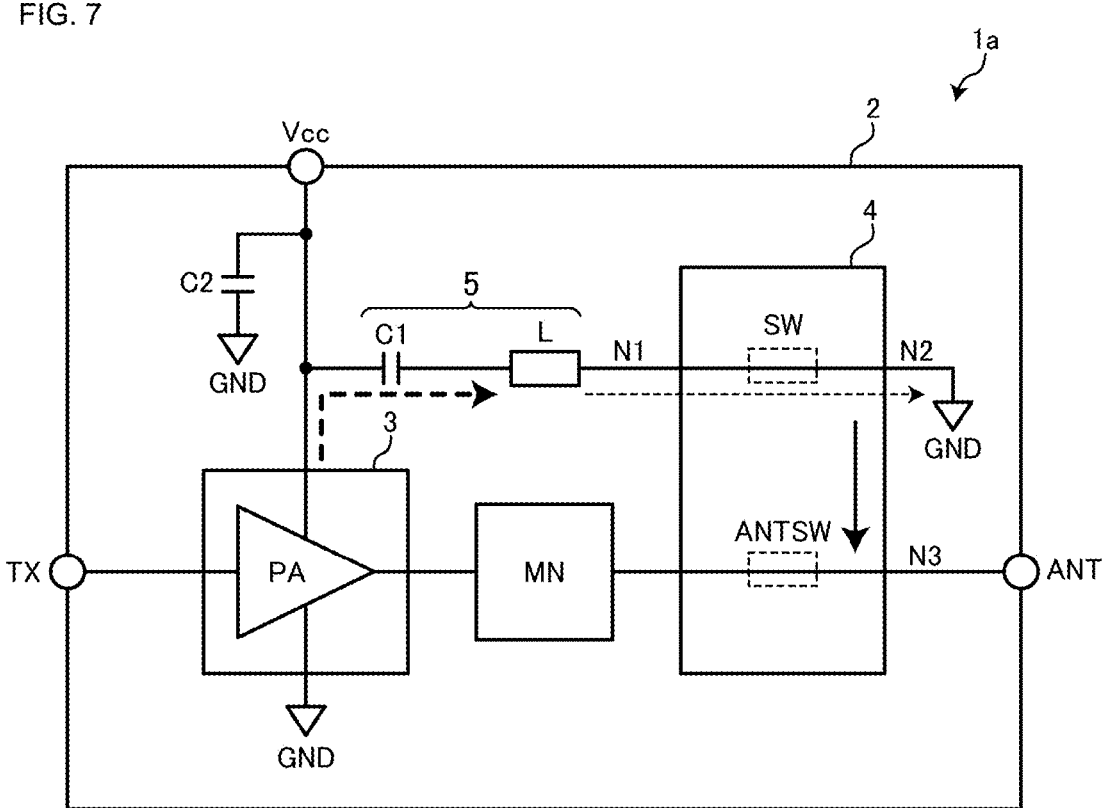
FIG. 7 is a diagram illustrating a form in the second mode according to exemplary aspects of the present disclosure.

FIG. 5 is a schematic view illustrating an exemplary radio-frequency circuit according to exemplary aspects of the present disclosure. FIG. 6 is a diagram illustrating a form in the first mode. FIG. 7 is a diagram illustrating a form in the second mode. In the first mode in FIG. 6, like the comparison example illustrated in FIG. 3, the switch circuit SW is controlled to be switched off; in the second mode in FIG. 7 like the comparison example illustrated in FIG. 4, the switch circuit SW is controlled to be switched on. In FIGS. 6 and 7, like the comparison example illustrated in FIGS. 3 and 4, the antenna switch circuit ANTSW is controlled to be switched on, and a radio frequency signal received by the second device 4 is output to the antenna terminal ANT.

As illustrated in FIG. 5, in the configuration of a radio-frequency circuit 1a, an inductor L is disposed on the propagation path of noise components caused by the first device 3. As illustrated in FIG. 5, an LC circuit 5, in which the first capacitor C1 and the inductor L are connected in series to each other, is connected, at its first end, to the supply path of the power supply voltage and is grounded, at its second end, through the switch circuit SW, which is disposed on the second device 4, in the second mode. The inductor L is, for example, a spiral inductor formed of a conductor included in the substrate 2. The form of the inductor L is not limited to this. For example, the inductor L may be formed of an SMD.

The form, in which the inductor L is disposed between the first capacitor C1 and the second device 4 including the switch circuit SW, is illustrated. However, the configuration is not limited this. For example, the inductor L may be disposed between the supply path of the power supply voltage and the first capacitor C1. In other words, any configuration may be employed as long as the LC circuit 5, in which the first capacitor C1 and the inductor L are connected in series to each other, is disposed between the supply path of the power supply voltage and the switch circuit SW disposed on the second device 4. That is, the LC circuit 5 is connected, at its first end, to the supply path of the power supply voltage and is grounded, at its second end, through the switch circuit SW on the second device 4 in the second mode.

Thus, as illustrated by using the dashed arrows in FIG. 7, compared with the configuration of the comparison example, the frequency bands of the harmonic components of a radio frequency signal undergo attenuation on the propagation path of the noise components caused by the first device 3. As illustrated by using the solid arrow in FIG. 7, coupling of the harmonic components to the output path of the radio frequency signal on the second device 4 is suppressed compared with the configuration of the comparison example. In other words, in the configuration of the radio-frequency circuit 1a, the harmonic components of a radio frequency signal, which propagate along the path connecting the first device 3 to the LC circuit 5, are attenuated compared with the harmonic components of a radio frequency signal, which propagate along the path connecting the LC circuit 5 to the GND potential. Thus, degradation of the distortion characteristics may be suppressed.

Figure 8:
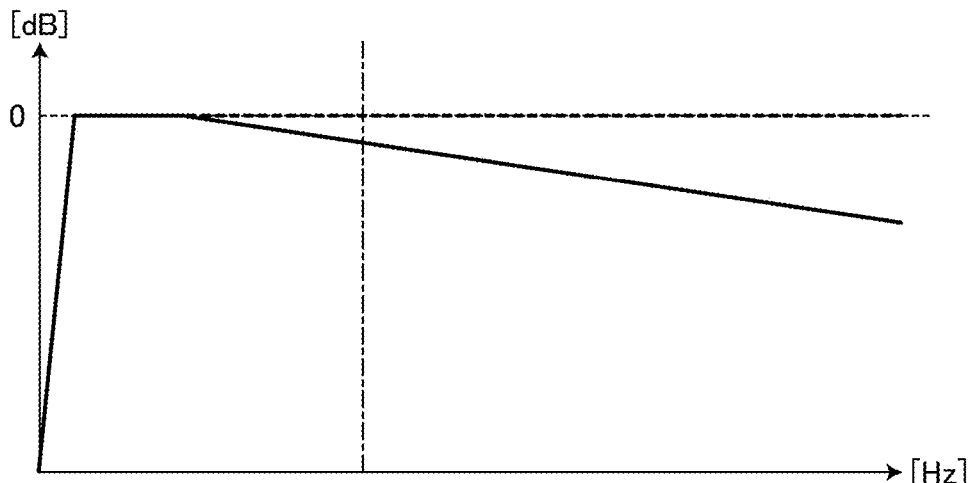
FIG. 8 is a diagram illustrating an example of bandpass characteristics from N1 node to N2 node.

FIG. 8 is a diagram illustrating an example of bandpass characteristics from N1 node to N2 node. In FIG. 8, the broken line indicates bandpass characteristics from N1 node to N2 node in the configuration according to the comparison example; the solid line indicates bandpass characteristics from N1 node to N2 node in the configuration.

Figure 9:
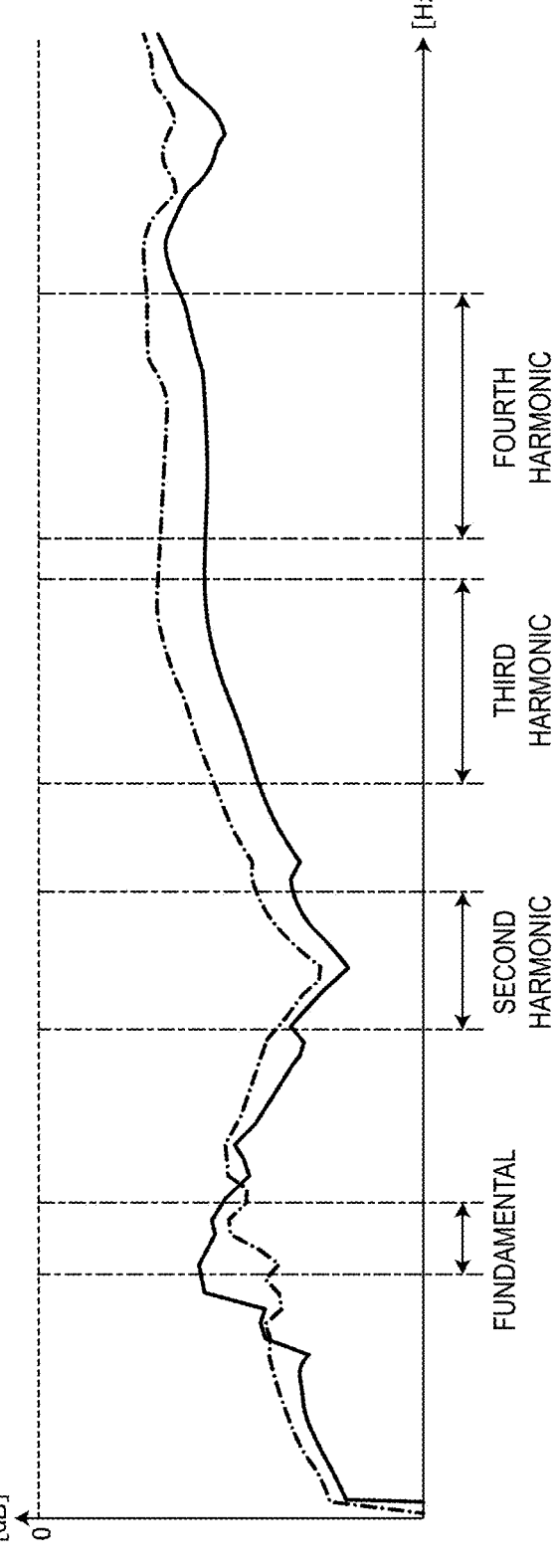
FIG. 9 is a diagram illustrating an example of isolation characteristics between N2 node and N3 node.

FIG. 9 is a diagram illustrating an example of isolation characteristics between N2 node and N3 node. In FIG. 9, the dot-dashed line indicates isolation characteristics between N2 node and N3 node in the configuration according to the comparison example; the solid line indicates isolation characteristics between N2 node and N3 node in the configuration according to the embodiment.

The inductance value of the inductor L is, for example, about several nanohenries (for example, 1 nH or greater). The capacitance value of the first capacitor C1 is, for example, in the order of 1000 pF. Therefore, the resonant frequency of the LC resonant circuit is lower than fundamental components (for example, around a range of 3 GHz to 5 GHz) of a radio frequency signal. As illustrated in FIG. 8, the bandpass characteristics from N1 node to N2 node are suppressed compared with the comparison example due to operation of inductance components of the inductor L in the frequency band (the band greater than or equal to the value indicated by the dot-and-dash line in FIG. 8) of high frequency components of a radio frequency signal. As illustrated in FIG. 9, the isolation characteristics between N2 node and N3 node may be also improved compared with the comparison example in the frequency bands of the high frequency components of a radio frequency signal. The capacitance value of the second capacitor C2 is in the order of 30 pF to 50 pF (for example, 33 pF).

As described above, the radio-frequency circuit 1 includes the power amplifier circuit PA and the LC circuit 5. The power amplifier circuit PA amplifies a radio frequency signal by switching between the first mode, in which power is amplified by using the envelope tracking (ET) system, and the second mode, in which power is amplified by using the average power tracking (APT) system. The LC circuit 5 is connected, at its first end, to the power supply path of the power amplifier circuit PA, and is grounded, at its second end, through the switch circuit. The LC circuit 5 includes the first capacitor C1 and the inductor L connected in series to the first capacitor C1. In this configuration, the switch circuit SW is controlled to be switched off in the first mode, and is controlled to be switched on in the second mode.

This configuration may suppress degradation of the distortion characteristics which is caused by coupling noise components, which are caused by the power amplifier circuit PA and which propagate through the LC circuit 5 in the second mode, to the output signal path.

In addition, the radio-frequency circuit 1 includes the first device 3, which includes the power amplifier circuit PA, the second device 4, which includes the switch circuit SW, and the substrate 2, on which the first device 3 and the second device 4 are mounted. The second device 4 includes the antenna switch circuit ANTSW as the output path of a radio frequency signal. The first device 3 is an HBT device including a heterojunction bipolar transistor, and the second device 4 is a silicon device including a silicon transistor.

In this configuration, the switch circuit SW and the antenna switch circuit ANTSW, which is the output path of a radio frequency signal, are formed on the die of the second device 4. Therefore, the harmonic components of a radio frequency signal, which are noise components caused by the first device 3, may be coupled to the output path of the radio frequency signal on the second device 4, resulting in degradation of the distortion characteristics.

In the radio-frequency circuit 1, the LC circuit 5, in which the first capacitor C1 and the inductor L are connected in series to each other, is connected, at its first end, to the supply path of the power supply voltage, and is grounded, at its second end, through the switch circuit SW, which is disposed on the second device 4, in the second mode. The inductor L may be, for example, a spiral inductor formed of a conductor included in the substrate 2, or may be formed of an SMD. Thus, the frequency bands of the harmonic components of a radio frequency signal undergo attenuation on the propagation path of noise components caused by the first device 3, and coupling of the harmonic components to the output path of a radio frequency signal on the second device 4 is suppressed. This achieves suppression of degradation of the distortion characteristics.

The above descriptions are made to facilitate understanding of the present disclosure and do not limit the present disclosure. The present disclosure may be changed or improved without departing from its gist, and encompasses its equivalents.

The present disclosure may have configurations, which are described below, as described above or instead of the description above.

(1) A radio-frequency circuit according to an exemplary aspect of the present disclosure includes an amplifier circuit that amplifies a radio frequency signal by switching between a first mode and a second mode, the first mode being a mode in which power is amplified by using an envelope tracking system, the second mode being a mode in which power is amplified by using an average power tracking system, and an LC circuit that is connected, at a first end thereof, to a power supply path of the amplifier circuit and that is grounded, at a second end thereof, through a switch circuit. The LC circuit includes a first capacitor and an inductor that is connected in series to the first capacitor. The switch circuit is controlled to be switched off in the first mode and is controlled to be switched on in the second mode.

(2) The radio-frequency circuit according to (1) further includes a second capacitor that is connected, at a first end thereof, to the power supply path of the amplifier circuit and that is grounded at a second end thereof.

(3) The radio-frequency circuit according to (1) or (2) includes a first device that includes the amplifier circuit, a second device that includes the switch circuit, and a substrate that includes the first device and the second device. The second device has an output path of a radio frequency signal having been amplified by the amplifier circuit.

(4) In the radio-frequency circuit according to (3), the first device is an HBT device including a heterojunction bipolar transistor. The second device is a FET device including a silicon transistor.

(5) In the radio-frequency circuit according to (3) or (4), the inductor is a spiral inductor formed of a conductor included in the substrate.

(6) In the radio-frequency circuit according to (3) or (4), the inductor is a surface mount device mounted on the substrate.

(7) The radio-frequency circuit according to (2), comprising:
  a first device that includes the amplifier circuit;
  a second device that includes the switch circuit; and
  a substrate that includes the first device and the second device mounted thereon,
  wherein the second device has an output path of a radio frequency signal having been amplified by the amplifier circuit.

(8) The radio-frequency circuit according to (3), wherein the HBT is a gallium arsenide (GaAs) HBT.

(9) The radio-frequency circuitry according to any of (1) to (8), wherein the substrate includes a low temperature co-fired ceramics (LTCC) substrate.

(10) The radio-frequency circuit according to any one of (1) to (9), wherein the substrate includes a resin multilayer substrate.

(11) The radio-frequency circuit according to any one of (1) to (10), wherein the substrate is a film substrate.

(12) The radio-frequency circuit according to any one of (1) to (11), comprising switching circuit to switch between the first mode and the second mode.

(13) The radio-frequency circuit according to (12), wherein the switching circuit includes two switches.

(14) The radio-frequency circuit according to (13), wherein one of the two switches switches an output destination of a radio-frequency signal received from the amplifier circuit.

(15) The radio-frequency circuit according to (14), wherein the output destination of the radio-frequency signal includes at least an antenna terminal.

(16) The radio-frequency circuit according to (14), wherein the radio-frequency signal is received by the switching circuit from the amplifier circuit via a matching circuit.

(17) The radio-frequency circuit according to (16), wherein the matching circuit is a surface mound device mounted on the substrate.

(18) The radio-frequency circuit according to (15), wherein the output destination of the radio-frequency circuit include a plurality of antenna terminals.

The present disclosure achieves a radio-frequency circuit which may suppress degradation of distortion characteristics which is caused by coupling harmonic components, which are generated by an amplifier circuit, to an output signal path.

What is claimed is:
1. A radio-frequency circuit comprising:
  an amplifier circuit that amplifies a radio frequency signal by switching between a first mode and a second mode, the first mode being a mode in which power is amplified by using an envelope tracking system, the second mode being a mode in which power is amplified by using an average power tracking system; and
  an LC circuit that is connected, at a first end thereof, to a power supply path of the amplifier circuit and that is grounded, at a second end thereof, through a switch circuit,
  wherein the LC circuit includes
    a first capacitor, and
    an inductor that is connected in series to the first capacitor, and
  wherein the switch circuit is controlled to be switched off in the first mode and is controlled to be switched on in the second mode.

2. The radio-frequency circuit according to claim 1, further comprising:
  a second capacitor that is connected, at a first end thereof, to the power supply path of the amplifier circuit and that is grounded at a second end thereof.

3. The radio-frequency circuit according to claim 1, comprising:
  a first device that includes the amplifier circuit;
  a second device that includes the switch circuit; and
  a substrate that includes the first device and the second device mounted thereon,
  wherein the second device has an output path of a radio frequency signal having been amplified by the amplifier circuit.

4. The radio-frequency circuit according to claim 3,
  wherein the first device is a heterojunction bipolar transistor (HBT) device including a heterojunction bipolar transistor, and
  wherein the second device is a field effect transistor (FET) device including a silicon transistor.

5. The radio-frequency circuit according to claim 3,
  wherein the inductor is a spiral inductor formed of a conductor included in the substrate.

6. The radio-frequency circuit according to claim 4,
  wherein the inductor is a spiral inductor formed of a conductor included in the substrate.

7. The radio-frequency circuit according to claim 3,
  wherein the inductor is a surface mount device mounted on the substrate.

9

8. The radio-frequency circuit according to claim 4,
wherein the inductor is a surface mount device mounted
on the substrate.

9. The radio-frequency circuit according to claim 2,
comprising:
a first device that includes the amplifier circuit;
a second device that includes the switch circuit; and
a substrate that includes the first device and the second
device mounted thereon,
wherein the second device has an output path of a radio
frequency signal having been amplified by the amplifier
circuit.

10. The radio-frequency circuit according to claim 3,
wherein the HBT is a gallium arsenide (GaAs) HBT.

11. The radio-frequency circuit according to claim 1,
wherein the substrate includes a low temperature co-fired
ceramics (LTCC) substrate.

12. The radio-frequency circuit according to claim 1,
wherein the substrate includes a resin multilayer substrate.

13. The radio-frequency circuit according to claim 1,
wherein the substrate is a film substrate.

14. The radio-frequency circuit according to claim 1,
comprising switching circuit to switch between the first
mode and the second mode.

15. The radio-frequency circuit according to claim 14,
wherein the switching circuit includes two switches.

16. The radio-frequency circuit according to claim 15,
wherein one of the two switches switches an output desti-
nation of a radio-frequency signal received from the ampli-
fier circuit.

17. The radio-frequency circuit according to claim 16,
wherein the output destination of the radio-frequency signal
includes at least an antenna terminal.

18. The radio-frequency circuit according to claim 16,
wherein the radio-frequency signal is received by the
switching circuit from the amplifier circuit via a matching
circuit.

19. The radio-frequency circuit according to claim 18,
wherein the matching circuit is a surface mound device
mounted on the substrate.

20. The radio-frequency circuit according to claim 17,
wherein the output destination of the radio-frequency circuit
include a plurality of antenna terminals.

* * * * *